United States Patent
Yang et al.

(10) Patent No.: US 7,224,061 B2
(45) Date of Patent: May 29, 2007

(54) PACKAGE STRUCTURE

(75) Inventors: Wen-Kun Yang, Hsin-Chu (TW);
Shih-Li Chen, Hsin-Chu (TW);
Wen-Bin Sun, Taipei (TW); Ming-Hui Lin, Miao-Li (TW); Chao-Nan Chou, Taipei (TW); Chih-Wei Lin, Tainan (TW)

(73) Assignee: Advanced Chip Engineering Technology Inc., Hsinchu Hsien (TW)

( * ) Notice: Subject to any disclaimer, the term of this patent is extended or adjusted under 35 U.S.C. 154(b) by 115 days.

(21) Appl. No.: 10/918,416

(22) Filed: Aug. 16, 2004

(65) Prior Publication Data

US 2006/0033196 A1    Feb. 16, 2006

(51) Int. Cl.
*H01L 23/48* (2006.01)
*H01L 23/52* (2006.01)
*H01L 29/40* (2006.01)

(52) U.S. Cl. .................. 257/737; 257/783; 257/787; 257/E23.116

(58) Field of Classification Search ............... 257/737, 257/787, 784
See application file for complete search history.

(56) References Cited

U.S. PATENT DOCUMENTS

| | | | | |
|---|---|---|---|---|
| 5,870,289 A * | 2/1999 | Tokuda et al. | ............... | 361/779 |
| 5,905,303 A * | 5/1999 | Kata et al. | ................... | 257/701 |
| 5,990,546 A * | 11/1999 | Igarashi et al. | ............. | 257/700 |
| 6,271,469 B1 * | 8/2001 | Ma et al. | ................... | 174/52.4 |
| 6,465,745 B1 * | 10/2002 | Fontacha et al. | ........... | 174/260 |
| 2002/0093107 A1 * | 7/2002 | Wu et al. | .................... | 257/780 |
| 2005/0029666 A1 * | 2/2005 | Kurihara et al. | ............. | 257/772 |

* cited by examiner

*Primary Examiner*—Nitin Parekh
(74) *Attorney, Agent, or Firm*—Birch, Stewart, Kolasch & Birch, LLP

(57) ABSTRACT

A package structure including a device, an interconnecting element, a pad and a protecting element is provided. The device connects with a first end of the interconnecting element through the pad. The protecting element covers the pad and the first end of the interconnecting element.

14 Claims, 4 Drawing Sheets

PACKAGE STRUCTURE

BACKGROUND OF THE INVENTION

1. Field of the Invention

The present invention relates to a package structure, and more particularly to a package structure with a protecting element.

2. Description of the Prior Art

The explosive growth of high-density packaging has created a tremendous impact on the electronic assembly and manufacturing industry. Ball grid array (BGA) and chip scale package (CSP) technologies take the lead in this advanced manufacturing process. Many major equipment makers and leading electronic companies now gear up for these emerging and advanced packaging technologies.

As shown in FIG. 1A, a product of the packaging technologies, i.e. a BGA package 11 with 1.27 mm pitch (distance between adjacent ball centers of balls 113), is illustrated. The BGA package 11 is the choice for packages with higher than 300 I/Os (input/output) count, replacing leaded packages such as the quad flat pack (QFP) even for lower I/Os at present.

In the last few years, the chip size package, CSP, market has been growing very rapidly. A major benefit of the CSP package is its compact size. As shown in FIG. 1B, a CSP package 13 (a.k.a fine pitch BGA packages, FPBGAs) is illustrated. The CSP package 13 is further miniaturized version of the BGA package 11, leaded, and leadless package with pitches less than 1.27 mm. The CSP package 13 has low mass and small package size, and is generally used for low I/Os (<100) for memory and has the potential for use higher (<300) I/Os. They also provide improved electrical and thermal performance, more effective manufacturing, and ease-of-handling compared to the conventional surface mount leaded parts such as thin small outline packages (TSOPs). However, there are some issues (mainly inspection and reliability) with the implementation of the new area array packages for high reliability applications.

As shown in FIG. 1C, a CSP package consists mainly of a device 131, sealing resin 135 and solder balls 139. The solder balls 139 connect with the device 131 through a plurality of interconnecting elements 137 and a plurality of pads 141. An isolating layer 143 and the sealing resin 135 isolate the device 131 and the interconnecting elements 137. Another isolating layer 145 covers the interconnecting elements 137 to protect the interconnecting elements 137 from breaking.

The CSP package is effective for reducing the mounting area but has some reliability problems with solder joints, especially with solder joints between the interconnecting elements 137 and the pads 141. The CSP package is difficult to absorb most of the strains generated by temperature changes or impacts by deformations of its leads. Thus, as for CSP packages, strains concentrated on solder joints between the interconnecting elements 137 and the pads 141 crack the joints and consequently lower the reliability.

Thus it is necessary to develop a package structure to prevent the reliability from lowering.

SUMMARY OF THE INVENTION

It is therefore an objective of preventing a solder joint from breaking.

It is another objective of the present invention to provide a package structure for absorbing strains formed on the solder joint generated by temperature changes.

It is still objective of the present invention to provide a package structure for absorbing strains formed on the solder joint generated by impacts by deformations of its leads.

It is yet another objective of the present invention to provide a package structure for increasing the reliability for operating the package.

In accordance with the present invention, these objectives are accomplished by providing a package structure, wherein the package structure includes a device connecting with an interconnecting element through a pad and a first end of the interconnecting element and a protecting element covering the pad and the first end of the interconnecting element.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENT

These preferred embodiments of the present invention are now described in greater detail. Nevertheless, it should be recognized that the present invention can be practiced in a wide range of other embodiments besides those explicitly described, and the scope of the present invention is expressly not limited except as specified in the accompanying claims.

Figure 1A:
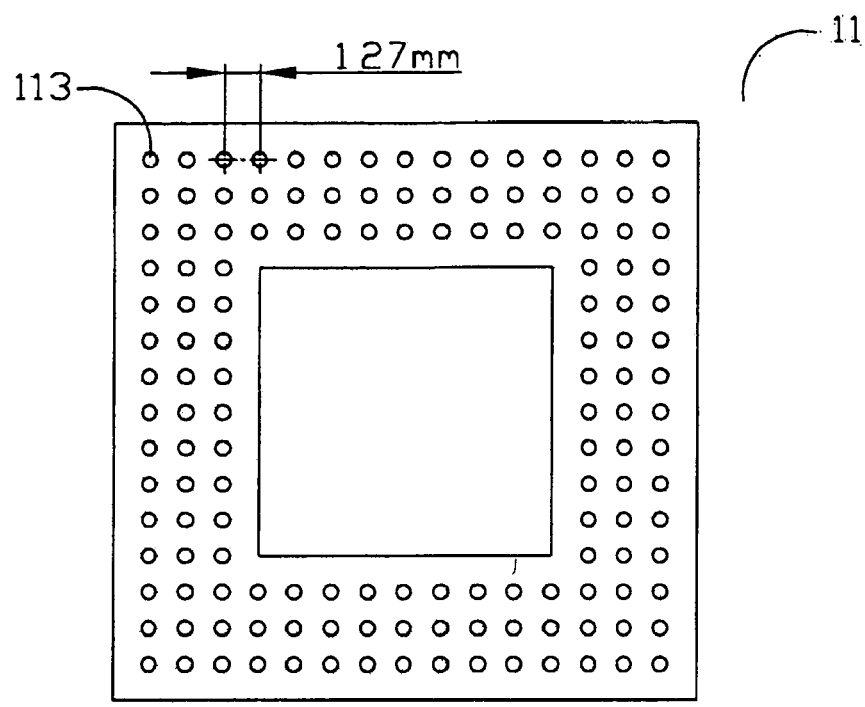
FIG. 1A illustrates a schematic diagram of a BGA package in the prior art.
Figure 1B:
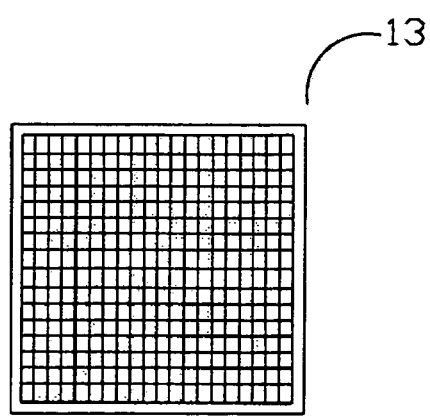
FIG. 1B illustrates a schematic diagram of a CSP package in the prior art.
Figure 1C:
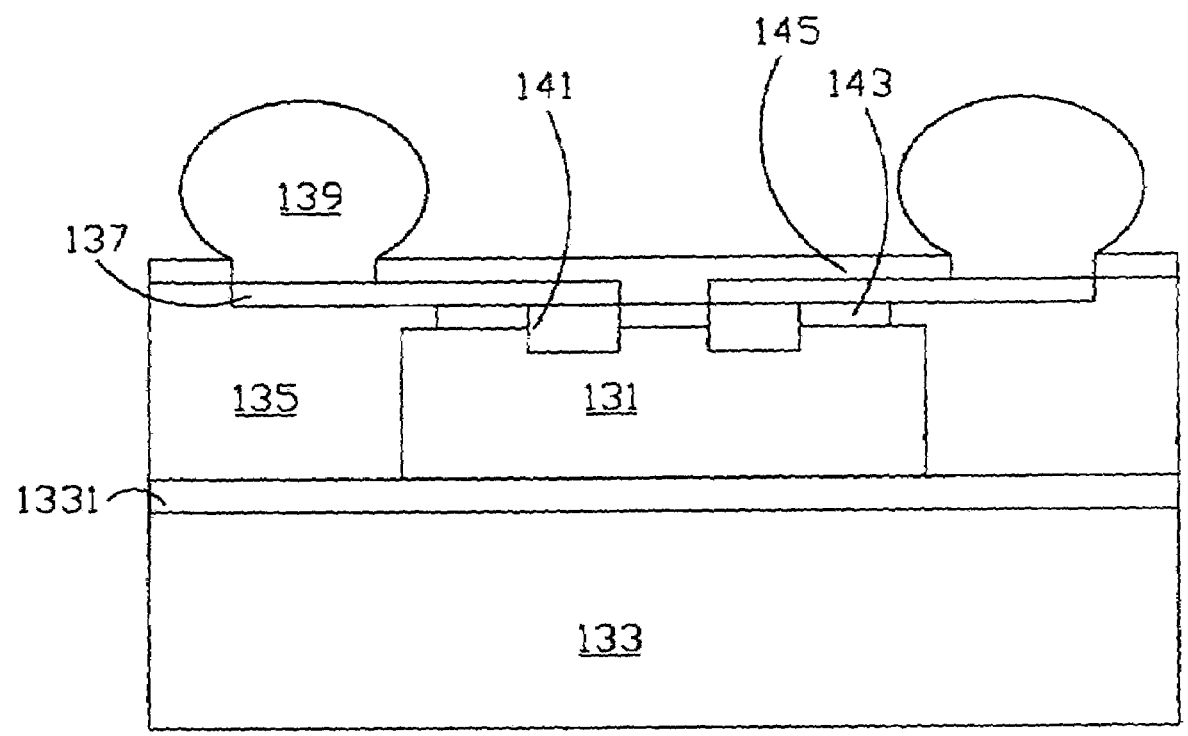
FIG. 1C illustrates a cross-sectional view of a CSP package in the prior art
Figure 2:
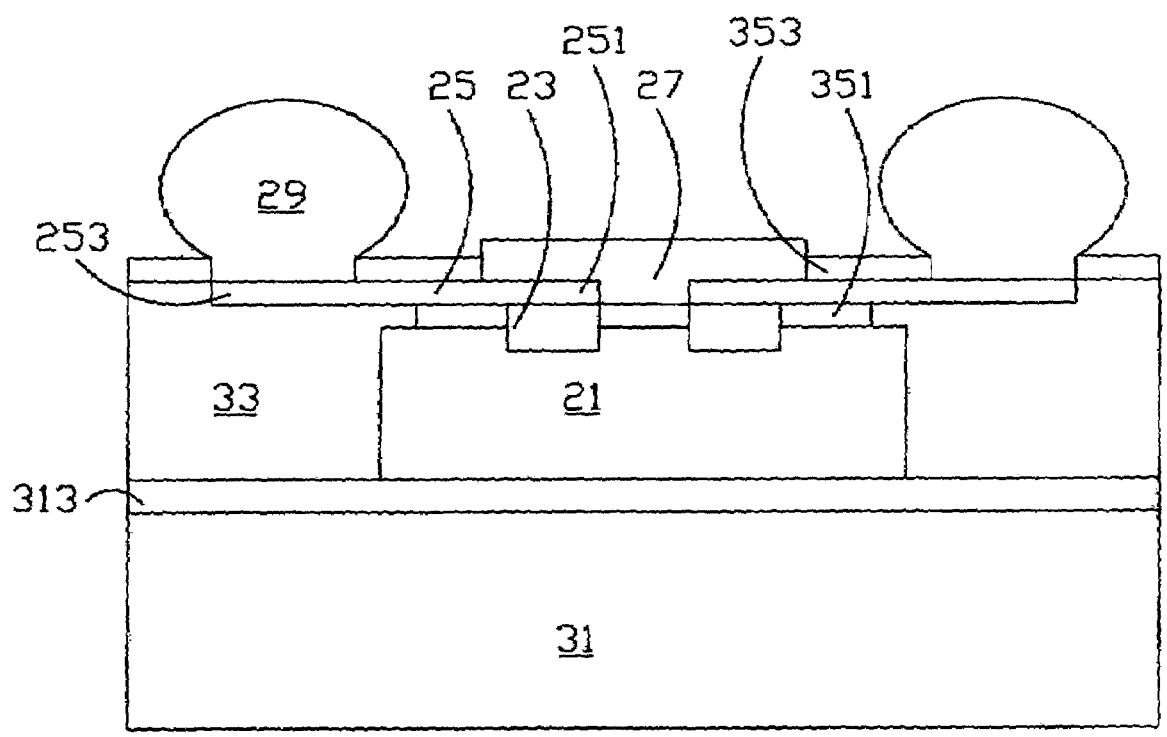
FIG. 2 illustrates a cross-sectional view of a package structure of the first embodiment of the present invention

As shown in FIG. 2, the first embodiment of the present invention provides a package structure including a device 21, a plurality of pads 23, a plurality of interconnecting elements 25 and a protecting element 27. The pad 23 connects with the device 21. The interconnecting element 25 includes a first end 251 and a second end 253, wherein the first end 251 connects with the pad 23. The protecting element 27 covers the pad 23 and the first end 251 of the interconnecting element 25. Besides, a plurality of connecting elements 29 connect with the device 21 through the second end 253 of the interconnecting element 25.

The protecting element 27 covers the first end 251 of the interconnecting element 25 and the pad 23 to prevent the solder joint between the pad 23 and the first end 251 of the interconnecting element 25 from breaking. When operates the device 21, the pad 23 connects well with the first end 251 due to the protecting element 27. The present protecting element 27 of the package absorbs most of the strains formed on the solder joint between the pad 23 and the interconnecting element 25 generated by temperature changes or impacts by deformations of its leads. Thus the connecting element 29 keeps in electrically connecting with the device 21. The reliability for operating the device 21 increases because the protecting element 27 covers the first end 251 of the interconnecting element 25 and the pad 23.

Besides, the package structure of the present package further includes some elements. A substrate 31 sticks on the back of the device 21 by an adhesive layer 313. A filler 33 is formed around the device 21 to protect the device 21. An isolating layer 351 is formed between the device 21 and the interconnecting elements 25. An isolating layer 353 is formed on the interconnecting element 25 and the device 21. Furthermore, the isolating layer 353 is also formed on the surface of the filler 33.

It is to be understood that many modifications and variations of the elements of the package are possible in light of the above teachings. For example, the device 21 of the first embodiment of the present invention is an active device, such as a silicon chip or a semiconductor chip. However, the device 21 of other embodiment of the present invention may be a passive device such as a resistor, a capacitor, a conductor, a sensor, or something connecting with a pad 23 and an interconnecting element 25. The protecting element 27 of the first embodiment of the present invention is made of plastic, ex. polypropylene, epoxy molding compound, etc. However, the protecting element 27 of other embodiment of the present invention may be made of a different material, ex. Ceramic, rubber, etc., according to the design of the package. The pad 23 of the first embodiment of the present invention is made of metal, ex. aluminum. The pad 23 of other embodiment may be made of a different material, ex. copper, nickel, etc., according to the design of the package of the present invention. The filler 33 formed around the device 21 of the first embodiment is made of ceramic. However, the filler 33 may be made of a different material, ex. plastic, resin, rubber, alloy, etc. The substrate 31 sticking on the device 21 of the first embodiment is made of glass. However, the substrate 31 of the different embodiment may be made of a rigid material, ex. glass, ceramic, alloy, metal, etc., or flexible material, ex. polypropylene, polyimide, epoxy, etc., according to the design of the package. The isolating layer 351 and 353 of the first embodiment of the present invention is made of SINR (silicon rubber). However, the isolating layer 351 and 353 of a different embodiment may be made of a different material, ex. polyimide, benzocyclobutene, epoxy solder mask, silicon glass etc.

Figure 3:
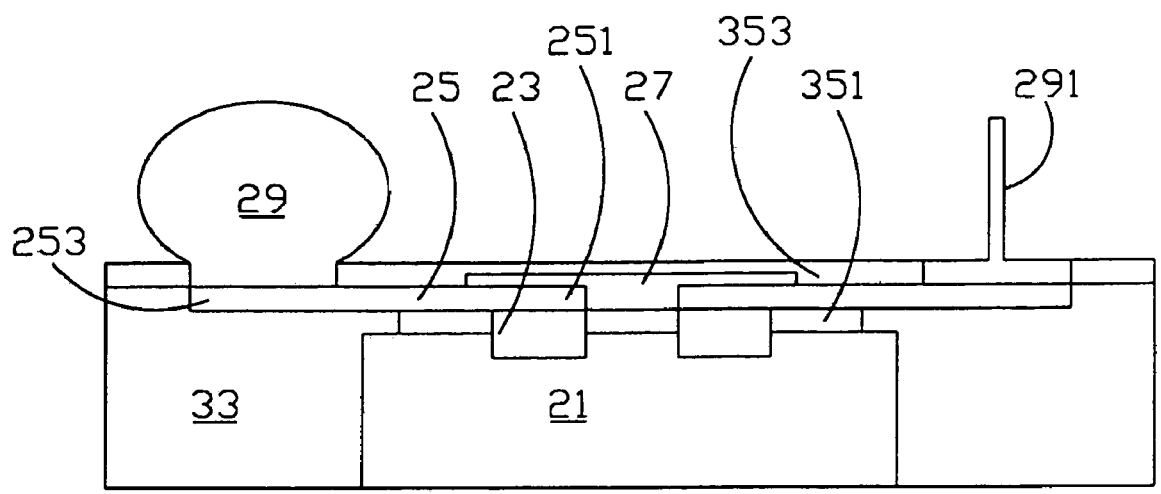
FIG. 3 illustrates a cross-sectional view of a package structure of the second embodiment of the present invention.

The connecting element 29 of the first embodiment of the present invention is a solder ball. However, a different kind of a connecting element 291 of the second embodiment is a pin, as shown in FIG. 3. The device 21 of the second embodiment is not stuck by the substrate 31. The protecting element 27 of the first embodiment is thicker than the isolating layer 353, but the protecting element 27 of the second embodiment is thinner than the isolating layer 353. Thus the isolating layer 353 is formed on the protecting element 27, the interconnecting element 25 and the device 21. The thickness of the present package without the substrate is thinner than the package stuck by the substrate 31. The size of the package of the second embodiment becomes smaller.

Figure 4:
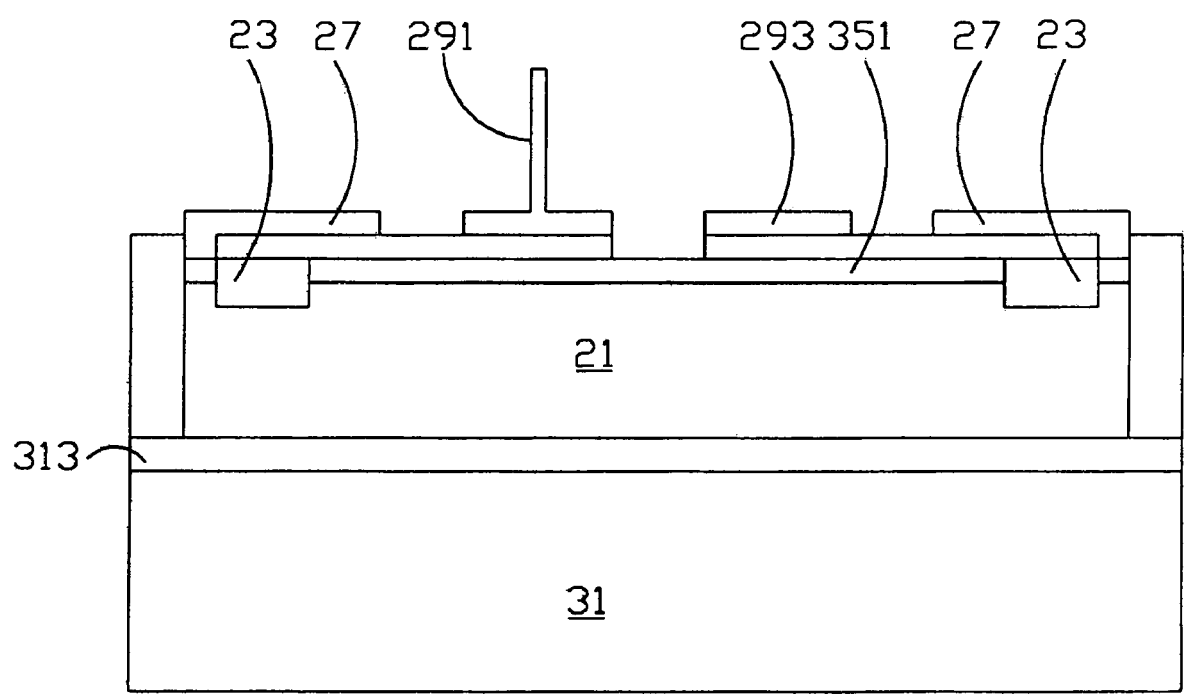
FIG. 4 illustrates a cross-sectional view of a package structure of the third embodiment of the present invention.

As shown in FIG. 4, the connecting element 291 of the third embodiment of the present invention is also a pin. Another connecting element 293 is a solder pad. The interconnecting element 25 is not covered with any isolating layer. Furthermore, the package structure includes a plurality of the protecting elements 27.

Figure 5:
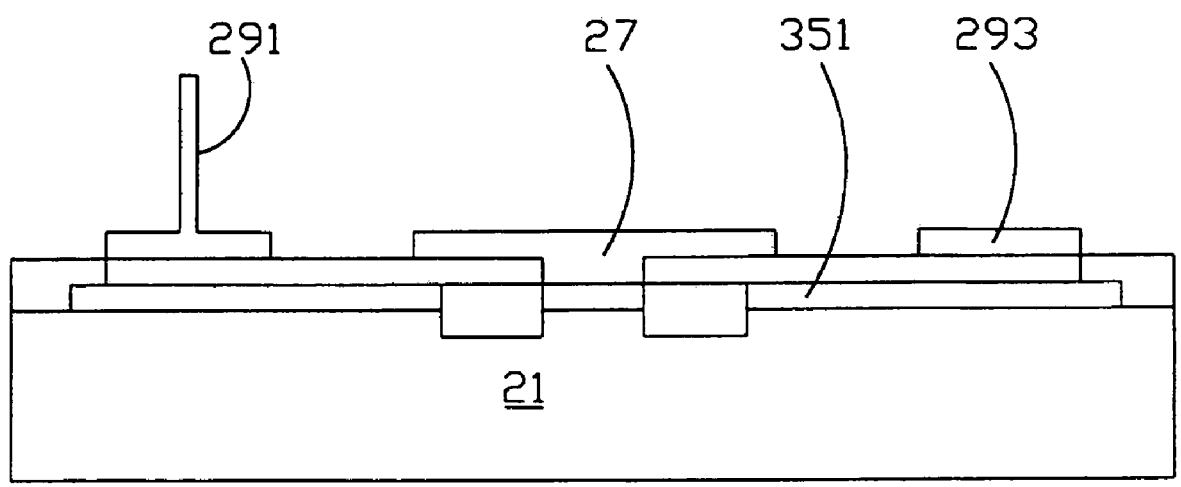
FIG. 5 illustrates a cross-sectional view of a package structure of the fourth embodiment of the present invention.

As shown in FIG. 5, the connecting element 291 of the fourth embodiment of the present invention is a pin. Another connecting element 293 is a solder pad. The interconnecting element 25 is not covered with an isolating layer. The device 21 is not stuck by a substrate and does not surrounded by a filler according to the design of the package. The thickness of the present package without stuck by the substrate and surrounded by the filler of the fourth embodiment becomes much smaller.

Although the package structure of the present embodiment includes only one device 21, the package structure may include more devices 21 according to the different design of the package structure. Furthermore, even if the elements, i.e. pads 23, interconnecting elements 25, protecting element 23 . . . etc. are set on the same surface of the device 21 of the described embodiment, the elements may set on different surfaces of the device 21 according to the different design of the package structure.

The present invention provides a package structure including a protecting element to protect the solder joint between a pad and an interconnecting element. The package structure of the present invention increases the reliability for operating the package due to the protecting element.

Obviously, many modifications and variations of the present invention are possible in light of the above teachings. It is to be understood that within the scope of the appended claims, the present invention may be practiced other than as specifically described herein.

Although the specific embodiments have been illustrated and described, it will be obvious to those skilled in the art that various modifications may be made without departing from what is intended to be limited solely by the appended claims.

What is claimed is:

1. A package structure, comprising:
    a device;
    a plurality of pads connecting with said device;
    at least an interconnecting element including a first end and a second end, the first and second ends being coplanar wherein said first end directly connects with said pad;
    a first isolating layer formed between said device and said interconnecting element;
    a connecting element connecting with said second end of said interconnecting element;
    a protecting element covering said plurality of pads and said first end of said interconnecting element to absorb strains formed on a solder joint between said plurality of pads and said interconnecting element generated by temperature changes or impacts by deformations of leads of said solder joint to prevent said solder joint from breaking, wherein said second end of said interconnecting element is not covered by said protecting element; and
    a second isolating layer formed on said interconnecting element and said device and wherein the first isolating layer and the protecting element not being extended laterally beyond a periphery of the device.

2. The package structure according to claim 1, wherein said device is an active device.

3. The package structure according to claim 1, wherein said device is a passive device.

4. The package structure according to claim 1, wherein said protecting element is made of plastic.

5. The package structure according to claim 1, wherein said protecting element is made of ceramic.

6. The package structure according to claim 1, wherein said protecting element is made of rubber.

7. The package structure according to claim 1, further comprising a substrate sticking on said device.

8. The package structure according to claim 7, wherein said substrate is made of rigid material.

9. The package structure according to claim 7, wherein said substrate is made of flexible material.

10. The package structure according to claim 1, wherein said second protecting element is thicker than said isolating layer formed on said interconnecting element and said device, and thus said protecting element is exposed outside said second isolating layer.

11. The package structure according to claim 1, wherein said protecting element is thinner than said second isolating layer formed on said interconnecting element and said device, and thus said protecting element is covered by said second isolating layer.

12. The package structure according to claim 1, wherein said connecting element is a solder ball.

13. The package structure according to claim 1, wherein said connecting element is a pin.

14. The package structure according to claim 1, wherein said connecting element is a solder pad.

* * * * *